United States Patent [19]

Chen et al.

[11] E Patent Number: Re. 32,925

[45] Reissued Date of Patent: May 16, 1989

[54] NOVEL AMORPHOUS METALS AND AMORPHOUS METAL ARTICLES

[75] Inventors: Ho-Sou Chen, Warren; Donald E. Polk, Morristown, both of N.J.

[73] Assignee: Allied-Signal Inc., Morris Township, Morris County, N.J.

[21] Appl. No.: 922,290

[22] Filed: Oct. 23, 1986

Related U.S. Patent Documents

Reissue of:

[64] Patent No.: 3,856,513
Issued: Dec. 24, 1974
Appl. No.: 318,146
Filed: Dec. 26, 1972

[51] Int. Cl.[4] ..... C22C 19/00; C22C 38/00

[52] U.S. Cl. ..... 148/403; 420/15; 420/16

[58] Field of Search ..... 148/403; 420/8, 10, 420/14–16, 27, 28, 34

[56] References Cited

U.S. PATENT DOCUMENTS

| | | | |
|---|---|---|---|
| 3,403,996 | 10/1968 | Hirota et al | 75/124 X |
| 3,406,057 | 10/1968 | Hirota et al. | 75/170 X |
| 3,427,154 | 2/1969 | Mader | 75/135 X |
| 3,433,630 | 3/1969 | Hirota | 75/120 |
| 3,461,943 | 8/1969 | Schile | 164/89 X |
| 3,542,542 | 11/1970 | Hirota | 75/170 |
| 3,543,831 | 12/1970 | Schile | 164/89 |
| 3,658,979 | 4/1972 | Dunn et al. | 164/82 |
| 3,845,805 | 11/1974 | Kavesh | 148/403 |

OTHER PUBLICATIONS

ITC Initial Determination No. 337-TA-143 (11/84).

Felsch, "Ferromagnetische Eigenschaften Amorpher Kobaltschichten", *Zeitschrift fur Angewandte Physik* (12/71).

Felsch, "Schinden aus Amorphem Eisen", *Zeitschrift fur Physik*, p. 195, 201-214 (12/66).

Dawez et al, "Amorphous Ferromagnetic Phase in Carbon-Phosphorus Alloys", *Journal of Applied Physics*, 38, 4096-4097 (12/67).

Campbell Memorial Lecture, *Transactions of the ASM*, 60, 607-633 (12/67).

Yamauchi et al, "Amorphous, Ferromagnetic Fe-P-B Alloys Prepared by a New Technique of Splat Cooling", *Jap. J. of Appl Phys* 10, 1730, (12/71).

Duwez, "Liquid Quenched Metallic Metastable Alloys", *Fizika*, vol. 2, Supplement 2 (12/70).

Masumoto et al, "The Mechanical Properties of Palladium 20/A/O Silicon Alloy Quenched from the Liquid State", *Acta Metallurgica*, vol. 19, Jul. 1971, pp. 725-741.

*Primary Examiner*—L. Dewayne Rutledge
*Assistant Examiner*—S. Kastler
*Attorney, Agent, or Firm*—Gus T. Hampilos

[57] ABSTRACT

Novel metal alloy compositions which are obtained in the amorphous state and are superior to such previously known alloys based on the same metals are provided; these new compositions are easily quenched to the amorphous state and possess desirable physical properties. Also disclosed is a novel article of manufacture in the form of wire of these novel amorphous metal alloys and of other compositions of the same type.

22 Claims, No Drawings

NOVEL AMORPHOUS METALS AND AMORPHOUS METAL ARTICLES

Matter enclosed in heavy brackets [ ] appears in the original patent but forms no part of this reissue specification; matter printed in italics indicates the additions made by reissue.

BACKGROUND OF THE INVENTION

This invention relates to novel amorphous metal compositions and to the preparation of wires of these and other amorphous metal alloys.

Heretofore, a limited number of amorphous, i.e., non-crystalline or glassy, metal alloys have been prepared. To obtain the amorphous state, a molten alloy of a suitable composition must be quenched rapidly, or alternatively, a deposition technique must be used: suitably employed vapor deposition, sputtering, electrode-position, or chemical (electro-less) deposition can be used to produce the amorphous metal.

The production of amorphous metal by these known techniques, i.e., either through a rapid quench of the melt or by deposition, severely limits the form in which the amorphous metal can be obtained. For example, when the amorphous metal is obtained from the melt, the rapid quench has generally been achieved by spreading the molten alloy in a thin layer against a metal substrate such as Cu or Al held at or below room temperature. The molten metal is typically spread to a thickness of about 0.002 inch which, as discussed in detail by R. Predecki, A. W. Mullendore and N. J. Grant in Trans. AIME 233, 1581 (1965) and R. C. Ruhl in Mat. Sci. & Eng. 1, 313 (1967), leads to a cooling rate of about $10^6$ °C./sec.

Various procedures have been proposed to provide rapid quenching by spreading the molten liquid in a thin layer against a metal substrate. Typical examples of such techniques are the gun technique of P. Duwez and R. H. Willens described in Trans. AIME 227, 362 (1963) in which a gaseous shock wave propels a drop of molten metal against a substrate made of a metal such as copper; the piston and anvil technique described by P. Pietrokowsky in Rev. Sci. Instr. 34, 445 (1963) in which two metal plates comes together rapidly and flatten out and quench a drop of molten metal falling between them; the casting technique described by R. Pond, Jr. and R. Maddin in Trans. Met. Soc. AIME 245, 2475 (1969) in which a molten metal stream impinges on the inner surface of a rapidly rotating hollow cylinder open at one end; and the rotating double rolls technique described by H. S. Chen and C. E. Miller in Rev. Sci. Instrum. 41, 1237 (1970) in which the molten metal is squirted into the nip of a pair of rapidly rotating metal rollers. These techniques produce small foils or ribbon-shaped samples in which one dimension is much smaller than the other two so that their usefulness as a practical matter is severely lmited. Because of the high cooling rates necessary to obtain the amorphous state from quenched liquid alloys, it is required that the amorphous metals be formed in a shape which does not preclude adequate quenching, i.e., they must have at least one dimension small enough to permit the sufficiently rapid removal of the heat from the sample.

Metal alloys which are most easily obtained in the amorphous state by rapid quenching or by deposition techniques are mixtures of transition metals with metalloids, i.e., semimetals. In each case, the alloy is approximately 80 atomic percent transition metal and 20 atomic percent metalloid. Examples of alloys of this type reportedly made previously in the amorphous state are $Pd_{84}Si_{16}$, $Pd_{79}Si_{21}$, $Pd_{77.5}Cu_6Si_{16.5}$, $Co_{80}P_{20}$, $Au_{76.9}Ge_{13.65}Si_{9.45}$, $Ni_{81.4}P_{18.6}$, $Fe_{80}P_{13}C_7$, $Ni_{15}Pt_{60}P_{25}$, $Ni_{42.5}Pd_{42.5}P_{15}$, $Fe_{75}P_{15}C_{10}$, $Mn_{75}P_{15}C_{10}$, $Ni_{80}S_{20}$, and $Ni_{78}B_{22}$ where the subscripts indicate atomic percent.

The cooling rate necessary to achieve the amorphous state, i.e., to avoid crystallization, and the stability of the amorphous state once it is obtained depends upon the composition of the alloy. Some of these alloys are better glass formers than others; there "better" alloys can be obtained in the amorphous state with a lower cooling rate, which in practice may be more readily obtainable, or can be obtained with a greater thickness when quenched from the melt with a given technique.

Generally, there is a small range of composition surrounding each of the known amorphous compositions where the amorphous state can be obtained. However, apart from quenching the alloys, no practical guideline is known for predicting with certainty which of the multitude of different alloys will yield an amorphous metal with given processing conditions and hence which of the alloys are "better" glass formers.

The amorphous and the crystalline state are distinguished by the respective absence or presence of long range periodicity. Further, the compositional ordering in alloys may be different for the two states. These differences are reflected in the differences in their x-ray diffraction behavior, and accordingly, x-ray diffraction measurements are most often used to distinguish a crystalline from an amorphous substance. Diffractometer traces of an amorphous substance reveal a slowly varying diffracted intensity, in many respects similar to a liquid, while crystalline materials produce a much more rapidly varying diffracted intensity. Also, the physical properties, which depend upon the atomic arrangement, are uniquely different for the crystalline and the amorphous state. The mechanical properties differ substantially for the two states; for example, a 0.002 inch thick strip of amorphous $Pd_{80}Si_{20}$ is relatively more ductile and stronger and will deform plastically upon sufficiently severe bending while a similar crystalline strip of the same composition is brittle and weak and will fracture upon identical bending. Further, the magnetic and electrical properties of the two states are different. In each case, the metastable amorphous state will convert to a crystalline form upon heating to a sufficiently high temperature with the evolution of a heat of crystallization.

It should be noted, moveover, that cooling a molten metal to a glass is distinctly different from cooling such a molten metal to the crystalline state. When a liquid is cooled to a glass, the liquid solidifies continuously over a range of temperature without a discontinuous evolution of a heat of fusion. In contrast, crystallization is a thermodynamic first order transition and thus is associated with a heat of fusion and a specific temperature.

SUMMARY OF THE INVENTION

An object of the invention is to provide a novel amorphous metal compositions which are readily quenched to the amorphous state, have increased stability, and possess desirable physical properties.

A further object of the invention resides in the provision of articles of manufacture of these novel amorphous metals in a variety of forms, e.g., ribbons, sheets, wire, powder, etc.

Another object of the invention is to provide an article of these and other amorphous metal compositions in the form of wire, i.e., a filament with a cross-section which is approximately circular, i.e., a rod-like filament, as contrasted with strands which are ribbon like.

Additional objects and advantages will become apparent from the description and examples provided.

The novel compositions of interest in this invention are composed primarily of Fe, Ni, Cr, Co, and V. Although certain compositions, i.e. $Fe_{75}P_{15}C_{10}$, $Fe_{80}P_{13}C_7$, $Fe_{80}P_{13}B_7$, $Co_{73}P_{15}B_{12}$, $Fe_{76}B_{17}C_7$ and $Ni_{75}P_{15}B_{10}$, have been previously described as being quenched from the melt to the amorphous state, we have discovered that certain novel, distinct and useful compositions may be obtained by the addition of small amounts, i.e., from 0.1 to 15 atomic percent but preferably from 0.5 to 6 atomic percent, of certain elements such as Al, Si, Sn, Sb, Ge, In, or Be, to such alloys. As a consequence of the introduction of these elements, these alloys become much better glass formers, i.e., the amorphous state is more readily obtained and moreover, is more thermally stable.

We have found that the inclusion of small amounts of certain elements of a group hereafter sometimes referred to by the symbol "Z", and consisting of Al, Si, Sn, Ge, In, Sb or Be, in amounts of from about 0.1 to about 15 atomic percent, to alloys of the type $$M_kY_p$$

wherein M is a metal selected from one or more of the group consisting of Fe, Ni, Co, V and Cr; and Y represents elements from the group consisting of P, B, and C; (k) and (p) are in atomic percent and are about 70 to 85 and about 30 to 15, respectively, provides superior glass forming alloys. Illustrative alloys, for example, are $Fe_{76}P_{15}C_5Si_1Al_3$, $Fe_{39}Ni_{39}P_{14}B_6Al_2$, $Ni_{74}P_{16}B_6Al_4$, and $Cr_{15}Co_{15}Ni_{45}P_{16}B_6Al_3$ and may have the general formula:

$$M_aY_bZ_c$$

wherein M, Y, and Z are as defined above and a, b, and c are in atomic percent and range from about 60 to 90, about 10 to 30 and about 0.1 to 15, respectively, and a plus b plus c equals 100.

Additionally, we have discovered that the alloy $Fe_{35}Ni_{45}P_{15}B_6$ and those alloys of similar compositions (e.g. $Fe_{44}Ni_{35}P_{13}B_7C_1$, $FE_{40}Ni_{40}P_{14}B_6$, $Fe_{30}Ni_{50}P_{16}B_6$) are superior glass forming alloys.

Selected alloys of the kinds disclosed above may be relatively more consistently and more readily quenched to the amorphous state than previously thought possible with known Fe-Ni-Co- based alloys. Moreover, these alloys are more stable; upon heating, they show the thermal manifestation of the glass transition (a sudden increase in the specific heat) while previously known Fe-Ni-Co- based alloys do not. Typically, amorphous alloys which show this thermal manifestation of the glass transition are more readily obtained in the amorphous state than amorphous alloys which do not.

The compositions within the contemplation of the present invention can be obtained in the form of ribbons or strips using the apparatus described in the above-mentioned references, Pond and Maddin, or that of Chen and Miller, or other techniques which are similar in principle. Further, wider strips or sheets can be obtained with similar quench techniques when the molten metal is squirted as a sheet, for example, rather than with an approximately round cross section. Additionally, powders of such amorphous metals where the particle size ranges from about 0.0004 to 0.010 inch can be made by atomizing the molten alloy to droplets of this size and then quenching these droplets in a liquid such as water, refrigerated brine, or liquid nitrogen.

The alloys discussed above in each case are made from the high purity elements. However, in the utilization of these alloys, it is anticipated that the alloys would be made from the less expensive commercially available material which would have small amounts of other elements in solution. Thus, the alloys contemplated by the invention may contain fractional amounts of other elements which are commonly found in commerically available Fe or Ni alloys, for example, either as a result of the source of the primary metal or through a later addition. *Accordingly, up to ¼ of the metal may be replaced by elements commonly alloyed with iron or nickel.* Examples of such elements are Mo, Ti, Mn, W, Zr, Hf and Cu.

In addition to the novel amorphous compositions described herein, the invention contemplates a novel article of manufacture in the form of amorphous metal wires of these alloys and others of the transition metal-metalloid type. In providing the wire-form article, a stream of molten metal is formed by squirting the molten metal from a nozzle or otherwise forming a jet from a suitable die and approximately quenching the alloy.

Suitable compositions from which such wires are made may be represented by the general formula $$T_iX_j$$

wherein T is a transition metal or mixture of said transition metals and X is an element selected from the group consisting of phosphorus, boron, carbon, aluminum, silicon, tin, germanium, indium, beryllium and antimony and mixtures thereof and wherein i and j are atomic percent and range from about 70 to 87 and from about 13 to 30, respectively. It will be understood that not every alloy encompassed within the formula $T_iX_j$ will necessarily yield an amorphous product. For example, a given composition may form a crystalline wire with a particular quenching technique and diameter, while an amorphous wire may be formed with a different quenching technique which provides a higher cooling rate and/or with a smaller diameter. Additionally, some specific ratios within the general formula $T_iX_j$ cannot be quenched from the melt to a wire of diameter large enough to be useful.

While most metal wire is conventionally prepared by drawing the metal through successively smaller dies, such a technique is not appropriate in the production of wire of amorphous metals. Amorphous metals, because of the manner in which they must be obtained, are not available in the form and dimensions required of the starting materials which are to be drawn to wires.

The quenching of the molten jet to form an amorphous metal wire has been achieved by squirting the molten jet into stationary water or refrigerated brine. However, any process may be used to quench the molten jet to the amorphous state as long as the cooling rate is great enough to avoid crystallization and disruption of the molten jet from the wire form does not take place during cooling. The cooling rate experienced by the molten metal stream or jet during quenching is dependent upon both the technique used to cool the molten jet and the diameter of the jet; the cooling technique determines the rate at which heat is removed from the surface of the jet while the diameter determines the surface-to-volume ratio and hence the quantity of heat which must be removed per unit area to reduce the temperature a given amount. As noted heretofore, different compositions require different minimum cooling rates in order to obtain the amorphous state. Thus, in order to obtain an amorphous, as distinguished from crystalline, metal wire, the cooling technique, the jet diameter, and the alloy composition must be reconciled.

The amorphous metal wire contemplated by the invention may be derived from a range of compositions of the transition metalmetalloid type alloys including the novel compositions described above, previously inown amorphous compositions, from which wire form articles have not previously been prepared, as well as from other alloy compositions of the type $T_iX_j$.

The production of amorphous metal wires yields a number of advantages because of their unique properties which are not possessed by crystalline metal wires produced by ordinary techniques. For example, glassy metal wires are less sensitive than crystalline wire to radiation damage and have a small or even negative temperature coefficient of resistivity. In preparing the novel amorphous alloy compositions of the invention, important processing economies are also available; the amorphous wire form of certain compositions may be less expensive for the sizes and strengths which can be obtained than the commonly used drawn wire. The amorphous metal strands, wires, sheets, etc., contemplated by the invention, find a variety of uses such as reinforcement use, e.g. as tire cord or as reinforcement in molded thermoplastic or thermosetting plastics; as filter media; biomedical reinforcement, e.g. sutures; as relay magnets; corrosion resistant chemical processing equipment; and the like.

Typically, in accordance with the invention, wires of about 0.005 inch diameter are formed, although the invention is not restricted to such diameter. Additionally, these alloys are ideally suited for the melt spinning of wire since they are generally of a near-eutectic composition and hence have a relatively low liquidus temperature, i.e. the lowest temperature at which the alloy is totally liquid in equilibrium. This simplifies the processing of the alloy and expands the list of materials which can be used to contain the molten alloy and as nozzles or dies to form the molten stream. For example, $Fe_{76}P_{16}C_4Al_4$, which is 86.7 weight percent Fe, has a liquidus temperature of about 1020° C. while pure Fe melts at 1535° C.

Various processes can be used to achieve the necessary cooling to yield the amorphous alloys. As stated above, the stream of the molten jet may be squirted into stationary water or refrigerated brine and appropriately collected therefrom after it is quenched. Typical of other specific processes which may be adapted to produce amorphous metal wire in accordance with the invention include that process described by S. Kavesh in a copending U.S. patent application Ser. No. 306,472, filed Nov. 14, 1972; those by R. D. Schile in U.S. Pat. Nos. 3,461,943 and 3,543,831; and that described by S. A. Dunn, et al. in U.S. Pat. No. 3,658,979. While these same methods may be employed to yield either crystalline or amorphous metal, one skilled in the art would experience no difficulty in accordance with the teaching presented herein regarding the use of appropriate cooling rates, wire diameters and compositions so as to obtain an amorphous metal wire.

These amorphous alloys and wire form articles have very desirable physical properties. For example, high tensile strengths and a high elastic limit in the as-quenched state can be achieved as well as good corrosion resistance and unique magnetic properties in various selected compositions. Also, a number of compositions are found to be remarkably ductile in the amorphous state. Some specimens, for example, can be bent over radii of curvature less than their thickness and can be cut with scissors. Also, with these ductile samples, tensile strengths of up to 350,000 psi have been obtained in the as-quenched condition. Thus, the heat treatments often given crystalline materials to obtain high strength are obviated with the amorphous metal alloys. Alloy such as $Fe_{76}P_{15}C_4B_1Si_1Al_3$ can be quenched directly from the melt to form inexpensive, high strength wire which can be employed directly as a commercial product.

The amorphous alloys provide strong, corrosion-resistant material; selected compositions of these amorphous alloys are relatively unreactive with concentrated surfuric, hydrochloric, or nitric acid. For example, amorphous $Fe_{40}Ni_{38}P_{14}B_6Al_2$ is found to be several orders of magnitude less reactive than stainless steels with concentrated hydrochloric acid.

Further, it has been found that various of the metal alloys of the same general formula $T_iX_j$ considered above also have the desirable properties of high strength and hardness, ductility and corrosion resistance even when they are partially crystalline. The fraction of the sample that is crystalline can be estimated by suitably employed e-ray or electron diffraction, electron transmission microscopy, and thermal analysis. Hence, the invention thus also contemplates a metal wire which is partially crystalline but which is at least 50 percent amorphous. For example, such wires may be rendered partially crystalline because the quenching rate is lower than that required to obtain the totally amorphous state for the specific composition being quenched.

DESCRIPTION OF THE PREFERRED EMBODIMENTS

Typically, the preferred novel amorphous compositions of the invention are those characterized by the formula $$M_aY_bY_c \quad \text{(I)}$$

wherein M is a metal selected from the group consisting of iron, nickel, cobalt, chromium and vanadium and mixtures thereof; Y is an element selected from the group consisting of phosphorus, boron and carbon, and mixtures thereof; and Z is an element selected from the group consisting of aluminum, antimony, beryllium, germanium, indium, tin and silicon and mixtures thereof and wherein the relative proportions in atomic percentages range from about 75 to 80, b from about 19 to 22, and c from 1 to 3.

These metals offer a variety of characteristics which may make them suitable for a wide range of special applications. For example, amorphous alloys in which M is totally or primarily iron, e.g. $Fe_{77}P_{15}C_5Si_1Al_2$, are of particular interest because of their low cost and relatively high strength. Amorphous alloys such as $Ni_{48}$.

$Fe_{30}P_{14}B_6Al_2$ are of significance, for example, because of their special ease of formation in combination with high strength and corrosion resistance. Alloys which have a high chromium content, e.g. $Cr_{78}P_{14}B_4Si_4$, are exceptional in their hardness and corrosion resistance.

The wire form amorphous metal alloy products of the invention include the amorphous alloys defined by the formula (I) hereinabove and contemplates also wire form products of other amorphous metals as well and may be defined as those alloys having the formula $$T_iX_j \quad \text{(II)}$$

wherein T is a transition metal or mixture thereof and X is an element selected from the group consisting of aluminum, antimony, beryllium, boron, germanium, carbon, indium, phosphorus, silicon and tin and mixtures thereof and wherein the proportion in atomic percentages as represented by i and j are respectively from about 70 to about 87 and from about 13 to about 30 with the proviso that i plus j equals 100. The transition metals T are those of grou IB, IIIB, IVB, VB, VIB, VIIB and VIII of the Periodic Chart of the Elements and include the follow: scandium, yttrium, lanthanum, actinium, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, and gold; preferably Fe, Ni, Co, V, Cr, Pd, Pt and Ti.

The amorphous metal wires of composition $T_iX_j$ are typically from 0.001 to 0.020 inch in diameter, with diameters of 0.004 to 0.008 inch being preferred. Any suitable technique which cools the molten jet sufficiently fast to avoid crystallization or jet breakup can be used to quench the jet. The simplest such method is to squirt the molten metal stream into a suitably chosen liquid such as water or iced brine. An advantageous technique is that described in the copending application of S. Kavesh, Ser. No. 306,472, filed Nov. 14, 1972, in which the molten jet is quenched in a concurrently flowing stream of liquid. The novel compositions and article of the invention are not limited by this process, however, since various other processes which provide appropriate quenching conditions may be utilized, such as the processes described by R. D. Schile in U.S. Pat. Nos. 3,461,943 and 3,543,831, in which the cooling of the molten jet through corona discharge, gas jets, and/or the deposition on the stream of a colder substance are used.

The invention will be further described by the following specific examples. It will be understood, however, that although these examples may describe in detail certain preferred operating variables and proportions within the contemplation of the invention, they are provided primarily for purposes of illustration and the invention in its broader aspects is not limited thereto. Parts stated unless otherwise expressed are atomic percent.

EXAMPLE 1

Elemental Fe, P, C, Si and Al are weighed so that the product mixture yields the following alloy: $Fe_{76}P_{15}C_5Al_3Si_1$. The Fe, P and C [were] *are* sintered for 1 day in an evacuated sealed fused silica tube at 450° C., then melted in vacuum at 1050° C. This alloy is remelted in vacuum at 1100° C. with the Si and Al to give the final alloy. This alloy [was] *is* placed in a fused silica tube with a 0.012 inch diameter hole in the bottom and melted at 1,100° C. A gas pressure of 8 psi is applied to the tube to force the molten metal through the hole, and the stream of molten alloy is directed into the nip of the rotating double rolls, held at room temperature, described by Chen and Miller in Rev. Sci. Instrum. 41, 1237 (1970). The rolls are two inches in diameter and [were] *are* rotating at 1500 rpm. The quenched metal 171 was] *is* entirely amorphous as determined by x-ray diffraction measurements, [was] *is* ductile to bending and [exhibited] *exhibits* tensile strengths to 350,000 psi. Alloys containing only Fe-P-C, such as $Fe_{80}P_{15}C_5$, $Fe_{77}P_{16}C_7$, and $Fe_{75}P_{15}C_{10}$, similarly quenched, are brittle and partially crystalline, as determined by x-ray diffraction. Further, the amorphous $Fe_{76}P_{15}C_5Al_3Si_1$ alloy exhibits the thermal manifestation of the glass transition, i.e. rapid increase in the specific heat, while amorphous Fe-P-C alloys do not.

EXAMPLE 2

An alloy of composition $Ni_{48}Fe_{30}P_{14}B_6Al_2$ is melted at 1,020° C. and quenched to an amorphous metal in the manner of and following the procedure of Example 1. An alloy with improved thermal stability and high bending ductility, strength, and corrosion resistance is obtained. X-ray diffraction measurements are used to confirm its amorphous structure.

EXAMPLE 3

The molten alloy of Example 2 is quenched to the amorphous state using the Pond and Maddin Teaching wherein the molten stream is directed through a 0.020 inch hole onto the surface of a copper hollow cylinder which is open at one end, has an inner diameter of six inches, is at room temperature and is rotating at 2500 rpm. An amorphous metal ribbon having the properties of that obtained in Example 2 [was] *is* obtained.

EXAMPLES 4–17

Following procedures of Example 1, the amorphous alloys set forth in Table I [were] *are* obtained.

TABLE 1

| Example No. | Composition.Atomic % | X.Ray Diffraction Analysis |
|---|---|---|
| 4 | $Fe_{78}P_{13}C_3Al_3$ | amorphous |
| 5 | $Fe_{75}P_{16}C_3B_3Al_3Si_1$ | " |
| 6 | $Fe_{78}P_{13}C_1B_1Ge_1Sn_1Al_3$ | " |
| 7 | $Fe_{30}Ni_{30}P_{14}B_1Si_1Al_3$ | " |
| 8 | $Ni_{74}P_{10}B_1Al_1$ | " |
| 9 | $Fe_{20.5}Ni_{20.5}P_{10}B_2Al_1Sn_2$ | " |
| 10 | $Ni_{20}Co_{27}P_{13}B_1Si_1Al_1$ | " |
| 11 | $Fe_{30}Cr_{30}V_{30}P_{14}B_4C_3Si_1$ | " |
| 12 | $Fe_{76}P_{15}C_1Be_2Al_8$ | " |
| 13 | $Fe_{78}Ni_{30}P_{14}B_4In_1Al_8$ | " |
| 14 | $Fe_{77}Ni_{30}P_{14}B_4$ | " |
| 15 | $Fe_{30}Ni_{30}P_{14}B_4$ | " |
| 16 | $Fe_{77}Ni_{34}P_{14}B_3C_8$ | " |
| 17 | $Fe_{28}Ni_{34}P_{17}B_4$ | " |

EXAMPLE 18

The alloy of composition $Ni_{75}P_{16}B_6Si_3$ [was] *is* obtained in the amorphous state by flash evaporation as follows: A fine powder. ~100μ particles, of crystalline $Ni_{75}P_{16}B_6Si_3$, [was] *is* slowly sprinkled onto a hot tungsten filament (~1,600° C.) in a vacuum of about $10^{-6}$ mm Hg. The vaporized alloy [was] *is* condensed onto a nearby copper substrate kept at room temperature so that the amorphous state of the same composition [was] *is* achieved.

EXAMPLES 19–24

Following the procedure of Example 18, the amorphous alloys set forth in Table II [were] *are* obtained by flash evaporation.

TABLE II

| Example No. | Composition.Atomic % | X.Ray Diffraction Analysis |
|---|---|---|
| 19 | $Cr_{78}P_{14}B_2Si_4$ | amorphous |
| 20 | $Cr_{30}Ni_{47}P_{14}B_4Be_3$ | " |
| 21 | $Cr_{30}P_{14}B_{14}Ge_2Si_2$ | " |
| 22 | $Ni_{75}P_{14}B_4Al_3$ | " |
| 23 | $Co_{30}P_{15}B_3Si_2$ | " |
| 24 | $Ni_{41}Co_{41}P_{12}B_4Si_2$ | " |

EXAMPLE 25

A $Pd_{77.5}Cu_6Si_{16.5}$ alloy [was] *is* melted in a fused silica tube which [had been] *is* drawn to a point with a 0.008 inch hole at the tip and containing an argon atmosphere within a furnace held at 870° C. The melt [was] *is* held in the tube by its surface tension. The silica tube [was] *is* rapidly lowered through the furance so that the tip of the tube [was] *is* held 0.1 inch above the surface of water contained in a vessel at room temperature and the melt [was] *is* ejected into the water upon applying 6 psi of gas pressure into the tube. A continuous, smooth amorphous wire of round cross-section with a diameter of about 0.008 inch [was] *is* is obtained. The glassy (amorphous) nature of the wire product [was] *is* confirmed by x-ray diffraction. The wire has an elastic limit of about 160,000 psi and a tensile strength of about 230,000 psi which is about one-fiftieth of the Young's modulus for this glass, a value which approaches the theoretical strength of this material.

EXAMPLE 26

$Pd_{77.5}Cu_6Si_{16.5}$ [was] *is* melt spun to a wire of uniform cross section using the process and apparatus described by Kavesh in the above-noted U.S. application, Ser. No. 306,472, with an orifice diameter of 0.005 inch and 10° C. water as the quench medium to yield an amorphous product.

EXAMPLE 27

Following the procedure of Example 25, a $Ni_{47}Fe_{30}P_{14}B_6Si_1Al_2$ alloy [was] *is* melted at 1000° C. and ejected from a 0.005 inch hole into brine held at −20° C. to produce a glassy wire whose amorphouse character is confirmed by x-ray difraction.

EXAMPLE 28

Following the procedure of Example 26, a $Fe_{76}P_{15}C_4B_1Si_1Al_3$ alloy [was] *is* spun to a glassy wire using a 0.005 inch hole and −20° C. brine as the quench medium. The amorphous character of the wire is confirmed by x-ray diffraction.

EXAMPLE 29

Following the procedure of Example 26, a $Ni_{40}Pd_{40}P_{20}$ alloy [was] *is* melted at 700° C. and melt spun through a 0.005 inch orifice into iced brine at −20° C. to give a glass wire. The amorphous characterization is confirmed by x-ray diffraction.

We claim:

1. A metal alloy of the formula $M_aY_bZ_c$ which is at least 50 percent amorphous and wherein M is a metal selected from the group consisting [essentially] of iron, nickel, chromium, cobalt, or vanadium or a mixture thereof, Y is a metalloid selected from the group consisting of phosphorus, carbon and boron or a mixture thereof, and Z is an element selected from the group consisting of aluminum, silicon, tin, antimony, germanium, indium, and beryllium and mixtures thereof, "a", "b" and "c" are atomic percentages ranging from about 60 to 90, 10 to 30 and 0.1 to 15 respectively with the proviso that a plus b plus c equals 100.

2. The amorphous metal alloy of claim 1 wherein "a," "b" and "c" range from 69 to 84.5, 15 to 25, and 0.5 to 6, respectively.

[3. The amorphous metal alloy of claim 1 wherein up to about one-fourth of the metal M is replaced by elements commonly allowed with iron or nickel.]

4. As an article of manufacture, sheets, ribbons and powders of the amorphous metals having the compositions of claim 1.

[5. As an article of manufacture, sheets, ribbons and powders of the amorphous metals having the compositions of claim 3.]

6. As an article of manufacture, a metal wire comprising an alloy which is at least 50 percent amorphous and having a composition of the formula [$T_iX_j$ wherein T is a transition metal or mixture of said transition metals and X is an element selected from the group consisting of aluminum, antimony, beryllium, boron, germanium, carbon, indium, phosphorus, silicon, tin and mixtures thereof and wherein i and j are in atmoic percentages and range from about 70 to about 87 and from about 13 to about 30 respectively] *$M_aY_bZ_c$, wherein M is a metal selected from the group consisting of iron, nickel, chromium, cobalt, vanadium and mixtures thereof, with up to one fourth of the metal being replaceable with at least one or more elements commonly alloyed with iron or nickel, Y is a metalloid selected from the group consisting of phosphorus, carbon and boron and mixtures thereof, and Z is an element selected from the group consisting of aluminum, silicon, tin, antimony, germanium, indium, and beryllium and mixtures thereof, "a", "b" and "c" are in atomic percentages ranging from about 60 to 90, 10 to 30 and 0.1 to 15, respectively, with the proviso that a plus b plus c equals 100.*

[7. The article of claim 6 wherein i ranges from about 74 to about 84 and j ranges from about 16 to about 26.]

[8. Amorphous metal wire of claim 6 wherein iron comprises at least 60 atomic percent of T.]

*9. The amorphous metal alloy of claim 1, containing the metal (M) iron.*

*10. The amorphous metal alloy of claim 1, containing the metal (M) nickel.*

*11. The amorphous metal alloy of claim 1, containing the metal (M) cobalt.*

*12. The amorphous metal alloy of claim 1, containing the element (Z) silicon.*

*13. The amorphous metal alloy of claim 1, containing the element (Z)* aluminum.

*14. An at least 50 percent amorphous metal alloy of the compositional formula $M_aY_bZ_c$ and wherein M is a metal consisting essentially of metal selected from the group consisting of iron, nickel, chromium, cobalt, vanadium and mixtures thereof, Y is a metalloid selected from the group consisting of phosphorus, carbon and boron or a mixture*

*thereof, and Z is an element selected from the group consisting of aluminum and silicon and mixtures thereof, "a", "b" and "c" are atomic percentages ranging from about 60 to 90, 10 to 30 and 0.1 to 15 respectively with the proviso that a plus b plus c equals 100.*

*15. As an article of manufacture, sheets, ribbons and powders of the amorphous alloy having the compositions of claim 14.*

*16. The amorphous metal alloy of claim 14, containing the metal (M) iron.*

*17. The amorphous metal alloy of claim 14, containing the metal (M) cobalt.*

*18. The amorphous metal alloy of claim 14, containing the metal (M) nickel.*

*19. The amorphous metal alloy of claim 14, containing the element (Z) silicon.*

*20. The amorphous metal alloy of claim 14, containing the element (Z) aluminum.*

*21. An at least 50 percent amorphous metal alloy of the compositional formula $M_aY_bZ_c$ wherein M is a metal consisting essentially of metal selected from the group consisting of iron, nickel, chromium, cobalt, vanadium and mixtures thereof, Y is a metalloid selected from the group consisting of phosphorus, carbon and boron and mixtures thereof, and Z is an element selected from the group consisting of aluminum, silicon, tin, antimony, germanium, indium, beryllium and mixtures thereof, "a", "b" and "c" are atomic percentages ranging from about 60 to 90, 10 to 30 and 0.1 to 15 respectively with the proviso that a plus b plus c equals 100.*

*22. An at least 50 percent amorphous metal alloy of the compositional formula $M_aY_bZ_c$ wherein M is a metal consisting essentially of a metal selected from the group consisting of iron, nickel, chromium, cobalt, vanadium and mixtures thereof, up to about one-fourth of which may be replaced by elements commonly alloyed with iron or nickel, Y is a metalloid selected from the group consisting of phosphorus, carbon and boron and mixtures thereof, and Z is an element selected from the group consisting of aluminum and silicon and mixtures thereof, "a", "b" and "c" are atomic percentages ranging from about 60 to 90, 10 to 30 and 0.1 to 15 respectively with the proviso that a plus b plus c equals 100.*

*23. An at least 50 percent amorphous metal alloy of the compositional formula $M_aY_bZ_c$ wherein M is a metal selected from the group consisting of iron, nickel, chromium, cobalt, vanadium and mixtures thereof with up to one-fourth of the metal being replaced by elements commonly alloyed with iron or nickel, Y is a metalloid selected from the group consisting of phosphorus, carbon, boron and mixtures thereof, and Z is an element selected from the group consisting of aluminum, silicon, tin, antimony, germanium, indium, and beryllium and mixtures thereof, "a", "b" "c" are atomic percentages ranging from about 60 to 90, 10 to 30 and 0.1 to 15 respectively with the proviso that a plus b plus c equals 100.*

*24. An at least 50 percent amorphous metal alloy of the compositional formula $M_aY_bZ_c$ wherein M is a metal consisting of iron, nickel, chromium, cobalt, vanadium and mixtures thereof, with up to about one-fourth of the metal being replaced by at least one element selected from the group consisting of Cu, Hf, Mn, Nb, Ti, W and Zr, Y is a metalloid selected from the group consisting of phosphorus, carbon and boron or a mixture thereof, and Z is an element selected from the group consisting of aluminum, silicon, tin, antimomy, germanium, indium, and beryllium and mixtures thereof, "a", "b" and "c" are atomic percentages ranging from about 60 to 90, 10 to 30 and 0.1 to 15 respectively with the proviso that a plus b plus c equals 100.*

*25. The amorphous metal alloy of claim 21 wherein "a", "b" and "c" range from 69 to 84.5, 15 to 25, and 0.5 to 6, respectively.*

*26. As an article of manufacture, sheet, ribbon and powder of amorphous alloys having the compositions of claim 21.*

* * * * *